(12) United States Patent
Tomori

(10) Patent No.: US 12,060,239 B2
(45) Date of Patent: Aug. 13, 2024

(54) REEL BODY, METHOD FOR MANUFACTURING REEL BODY, AND METHOD FOR MANUFACTURING ARTICLE

(71) Applicant: Resonac Corporation, Tokyo (JP)

(72) Inventor: Naoki Tomori, Tokyo (JP)

(*) Notice: Subject to any disclaimer, the term of this patent is extended or adjusted under 35 U.S.C. 154(b) by 165 days.

(21) Appl. No.: 17/791,999

(22) PCT Filed: Aug. 20, 2021

(86) PCT No.: PCT/JP2021/030617
§ 371 (c)(1),
(2) Date: Jul. 11, 2022

(87) PCT Pub. No.: WO2022/102198
PCT Pub. Date: May 19, 2022

(65) Prior Publication Data
US 2023/0043876 A1    Feb. 9, 2023

(30) Foreign Application Priority Data
Nov. 10, 2020   (JP) .................................. 2020-187071

(51) Int. Cl.
*B65H 18/28*     (2006.01)
*B65D 85/67*     (2006.01)
(Continued)

(52) U.S. Cl.
CPC ............ *B65H 18/28* (2013.01); *B65D 85/67* (2013.01); *B65D 85/676* (2013.01); *B65H 19/10* (2013.01);
(Continued)

(58) Field of Classification Search
CPC .... B65H 18/02; B65H 18/026; B65H 18/028; B65H 18/04; B65H 18/08; B65H 18/085;
(Continued)

(56) References Cited

U.S. PATENT DOCUMENTS 675,077 A * 5/1901 Witham ............... B65H 75/185
242/613.5
3,116,864 A * 1/1964 Hawk .................. B65H 35/002
D9/419
(Continued)

FOREIGN PATENT DOCUMENTS

DE    102005060248 A1 * 6/2007 ............. B65H 16/02
JP    S48-068091        8/1973
(Continued)

OTHER PUBLICATIONS

International Search Report dated Nov. 16, 2021 for PCT/JP2021/030617.
(Continued)

*Primary Examiner* — Michael R Mansen
*Assistant Examiner* — Raveen J Dias
(74) *Attorney, Agent, or Firm* — SOEI PATENT & LAW FIRM

(57) ABSTRACT

A reel body is the reel body in which an adhesive film having an adhesive layer on a base material layer is wound around a winding core. The adhesive film does not have a protective layer on the adhesive layer and is wound around the winding core in a state in which the adhesive layer and the base material layer are contiguous to each other in the radial direction of the winding core. A width of the winding core in an axial direction is smaller than a width of the adhesive film. In a rolled body of the adhesive film, an overhang portion jutting out in the axial direction of the winding core is provided.

9 Claims, 7 Drawing Sheets

(51) Int. Cl.
*B65D 85/676* (2006.01)
*B65H 19/10* (2006.01)
*B65H 75/08* (2006.01)
*B65H 75/10* (2006.01)
*B65H 75/18* (2006.01)
*B65H 75/22* (2006.01)

(52) U.S. Cl.
CPC .............. *B65H 75/08* (2013.01); *B65H 75/10* (2013.01); *B65H 75/185* (2013.01); *B65H 75/2218* (2021.05); *B65H 2701/11332* (2013.01); *B65H 2701/1722* (2013.01); *B65H 2701/377* (2013.01)

(58) Field of Classification Search
CPC ........ B65H 18/10; B65H 18/28; B65H 23/00; B65H 23/0322; B65H 75/00; B65H 75/02; B65H 75/08; B65H 75/10; B65H 75/12; B65H 75/104; B65H 75/18; B65H 75/185; B65H 75/187; B65H 75/22; B65H 75/2245; B65H 75/2218; B65H 35/00; B65H 16/00; B65H 16/02; B65H 16/04; B65H 16/06; B65H 16/10; B65H 16/103; B65H 2701/11332; B65H 2701/1722; B65H 2701/17222; B65H 2701/337; B65H 75/50; B65H 19/10; B65H 19/102; B65H 19/18; B65H 2301/41764; B65H 2301/41766; B65H 2301/4631; B65H 35/0013; B65H 35/0033; B65H 35/0053; B65H 2701/50; B65H 75/3772; B65H 75/14; B65H 2701/377; C09J 7/00; C09J 7/20; C09J 2301/00; A47L 25/005; B65D 85/66; B65D 85/67; B65D 85/671; B65D 85/672; B65D 85/676

See application file for complete search history.

(56) References Cited

U.S. PATENT DOCUMENTS

| | | | | |
|---|---|---|---|---|
| 3,421,170 | A * | 1/1969 | Thomas, Jr. .......... | A47L 25/005 15/230.11 |
| 3,713,601 | A * | 1/1973 | Buhrman ................. | B41J 17/24 242/613.5 |
| 3,737,030 | A * | 6/1973 | Stewart .................. | B65H 75/10 242/610.4 |
| 3,742,547 | A * | 7/1973 | Sohmer .................. | A47L 25/005 15/144.3 |
| 6,390,428 | B1 * | 5/2002 | Oshima ................ | B65H 75/185 242/613.5 |
| 6,842,934 | B1 * | 1/2005 | McKay, Jr. ........... | A47L 25/005 428/126 |
| 7,438,254 | B2 * | 10/2008 | Oettershagen ....... | B65H 75/185 242/596.7 |
| 7,487,566 | B2 * | 2/2009 | McKay, Jr. ............. | A47L 25/08 15/104.002 |
| 9,936,857 | B1 * | 4/2018 | Menius ................. | A47L 25/005 |
| 2002/0190152 | A1 * | 12/2002 | Haraikawa ............ | B65H 18/28 242/608 |
| 2003/0039824 | A1 * | 2/2003 | Aalbers ................. | A47L 25/005 428/222 |
| 2005/0050661 | A1 * | 3/2005 | McKay, Jr. ............ | A47L 25/08 15/104.002 |
| 2005/0082192 | A1 * | 4/2005 | Smarr .................... | B65D 85/66 206/397 |
| 2006/0277866 | A1 * | 12/2006 | Bowden ................ | B65D 65/14 53/372.8 |
| 2007/0029437 | A1 * | 2/2007 | Gaines .................. | B65H 16/06 242/599.3 |
| 2007/0045465 | A1 * | 3/2007 | Oettershagen ........ | B65B 67/085 242/588.2 |
| 2008/0040873 | A1 * | 2/2008 | Schmidt ................ | A47L 25/005 15/104.002 |
| 2008/0226919 | A1 * | 9/2008 | Hosoda ................ | B65D 85/672 242/348 |
| 2011/0300326 | A1 * | 12/2011 | Tatsuzawa ................. | C09J 7/38 428/77 |
| 2013/0341225 | A1 * | 12/2013 | Risler .................... | B65D 85/00 206/413 |
| 2014/0361109 | A1 * | 12/2014 | Liu ........................ | B65H 75/10 34/406 |
| 2015/0122684 | A1 * | 5/2015 | Couchey ................ | B65D 85/66 206/415 |
| 2018/0194582 | A1 * | 7/2018 | Rozek .................... | A47K 10/38 |
| 2020/0048022 | A1 * | 2/2020 | Deiss .................... | B32B 27/065 |
| 2021/0269208 | A1 * | 9/2021 | Taguchi ................ | B65D 85/672 |
| 2021/0371225 | A1 * | 12/2021 | Blok ........................... | C09J 7/20 |
| 2022/0135359 | A1 * | 5/2022 | Wood .................... | B65H 75/185 242/416 |
| 2023/0039365 | A1 * | 2/2023 | Tomori .................. | B65H 18/08 |
| 2023/0040595 | A1 * | 2/2023 | Tomori ............. | B65H 23/1955 |

FOREIGN PATENT DOCUMENTS

| | | | |
|---|---|---|---|
| JP | S48-087354 | 10/1973 | |
| JP | 3002767 | 10/1994 | |
| JP | 2003206072 A * | 7/2003 | ............. B65H 75/02 |
| JP | 2018-090665 | 6/2018 | |
| JP | 2018-186906 | 11/2018 | |
| KR | 20120073539 A * | 7/2012 | ............. B65H 75/28 |
| KR | 102403240 B1 * | 8/2022 | ......... B65H 75/2281 |
| KR | 20230001573 A * | 1/2023 | ........... A47L 25/005 |
| WO | 01/035460 | 5/2001 | |

OTHER PUBLICATIONS

International Preliminary Report on Patentability with Written Opinion dated May 25, 2023 for PCT/JP2021/030617.

* cited by examiner (a)

(b)

REEL BODY, METHOD FOR MANUFACTURING REEL BODY, AND METHOD FOR MANUFACTURING ARTICLE

CROSS-REFERENCE TO RELATED APPLICATIONS

This application is a 35 U.S.C. § 371 national phase application of PCT/JP2021/030617, filed on Aug. 20, 2021, which claims priority to Japanese Patent Application No. 2020-187071, filed on Nov. 10, 2020.

TECHNICAL FIELD

The present disclosure relates to a reel body, a method for manufacturing a reel body, and a method for manufacturing an article.

BACKGROUND ART

Regarding a method for manufacturing an article using an adhesive film, for example, there is a method of sticking an adhesive film as a temporary protective tape on the back surface of a lead frame, as described in Patent Literature 1. In this method of Patent Literature 1, encapsulation of a semiconductor element is performed in a state in which the back surface of a lead frame is temporary protected with an adhesive film. Subsequently, the adhesive film is peeled off from the back surface of the lead frame.

CITATION LIST

Patent Literature

Patent Literature 1: International Publication WO 2001/035460

SUMMARY OF INVENTION

Technical Problem

On the occasion of manufacturing an adhesive film, a reel body is formed by winding the adhesive film around a winding core. The manufactured adhesive film is distributed in a state of a reel body and used while set on a user-side feeding apparatus. In common reel bodies, when a reel body in which the width of the winding core in the axial direction and the width of the adhesive film are aligned is set on a feeding apparatus, alignment is achieved based on the end faces in the axial direction of a rolled body of the adhesive film.

However, conventional reel bodies have a problem that when the adhesive film is even slightly shifted in the axial direction at the time of winding, the winding core protrudes in the axial direction from the rolled body of the adhesive film. When the winding core protrudes in the axial direction, alignment cannot be based on the end faces in the axial direction of the rolled body of the adhesive film, and trouble occurs in the alignment when the adhesive film is set on the feeding apparatus. Particularly, in an adhesive film that has no protective layer on the adhesive layer and is wound around a winding core in a state in which the adhesive layer and the base material layer are contiguous to each other in the radial direction of the winding core, even when force is applied to the rolled body, it is difficult to move the position of the adhesive film with respect to the winding core. For this reason, there is a risk that it may be necessary to perform alignment for each and every reel body to be set.

The present disclosure was achieved in order to solve the above-described problems, and it is an object of the present disclosure to provide a reel body for which the trouble of alignment at the time of setting the reel body on a feeding apparatus can be saved, a method for manufacturing a reel body, and a method for manufacturing an article.

Solution to Problem

A reel body according to an aspect of the present disclosure is a reel body in which an adhesive film having an adhesive layer on a base material layer is wound around a winding core, the adhesive film does not have a protective layer on the adhesive layer and is wound around the winding core in a state in which the adhesive layer and the base material layer are contiguous to each other in a radial direction of the winding core, a width of the winding core in the axial direction is smaller than a width of the adhesive film, and a rolled body of the adhesive film is provided with an overhang portion jutting out in the axial direction of the winding core.

In this reel body, a width of the winding core in the axial direction is smaller than a width of the adhesive film, and the rolled body of the adhesive film juts out in the axial direction of the winding core. For this reason, even when the adhesive film is slightly shifted in the axial direction of the winding core at the time of winding, the winding core can be suppressed from protruding in the axial direction from the rolled body of the adhesive film. As a result of suppressing the protrusion of the winding core, when the reel body is set on a feeding apparatus, alignment based on the end faces in the axial direction of the rolled body of the adhesive film is made easier, and the trouble of alignment can be saved.

The overhang portion may be provided on each of one side and the other side in the axial direction of the winding core. In this case, position shift of the adhesive film at the time of winding can be allowed on each of one side and the other side in the axial direction of the winding core.

The overhang portion may be provided only on either of the one side and the other side in the axial direction. In this case, a large allowance of position shift of the adhesive film at the time of winding can be secured either on one side or on the other side in the axial direction. Furthermore, on the opposite side of the overhang portion, an end face in the axial direction of the rolled body and an end face in the axial direction of the winding core are aligned. Therefore, in a case where the end face on the opposite side of the overhang portion is used as the basis of alignment, restrictions at the time of setting the reel body on the feeding apparatus can be avoided without depending on the width in the axial direction of the overhang portion.

On a side of the inner circumference of the overhang portion, an auxiliary core that has the same diameter as the winding core and is freely attachable and detachable may be disposed. In this case, the occurrence of undulation of the adhesive film at the overhang portion can be suppressed. At the time of setting the reel body on the feeding apparatus, alignment based on an end face in the axial direction of the rolled body of the adhesive film can be easily carried out by removing the auxiliary core.

At an end face in the axial direction of the rolled body of the adhesive film, a guide plate that aligns an edge in a width direction of the adhesive film with this end face may be disposed. As a result of disposing such a guide plate, the end face in the axial direction of the rolled body of the adhesive film, which serves as the basis of alignment in the feeding apparatus, can be protected.

A method for manufacturing a reel body according to an aspect of the present disclosure is a method for manufacturing a reel body, the method having a winding step of winding an adhesive film having an adhesive layer on a base material layer around a winding core, in which in the winding step, the winding core having a smaller width in an axial direction than a width of the adhesive film is used, and an adhesive film that does not have a protective layer on the adhesive layer is wound around the winding core while arranging the adhesive layer and the base material layer to be contiguous to each other in a radial direction of the winding core, so that an overhang portion jutting out in the axial direction of the winding core is formed in a rolled body of the adhesive film.

In this method for manufacturing a reel body, an overhang portion jutting out in the axial direction of the winding core is formed in the rolled body of the adhesive film by using a winding core having a smaller width in the axial direction than the width of the adhesive film. In the obtained reel body, even when the adhesive film is slightly shifted in the axial direction of the winding core at the time of winding, the winding core can be suppressed from protruding in the axial direction from the rolled body of the adhesive film. As a result of suppressing protrusion of the winding core, when the reel body is set on the feeding apparatus, alignment based on the end faces in the axial direction of the rolled body of the adhesive film is made easier, and the trouble of alignment can be saved.

A method for manufacturing an article according to an aspect of the present disclosure is a method for manufacturing an article, the method having a joining step of joining the adhesive film wound off from the above-described reel body to an adherend, in which in the joining step, a side of the inner circumference of the overhang portion in the reel body is fixed to a winding core tool of a feeding apparatus, and at the same time, the adhesive film is wound off toward the adherend in a state in which the end faces in the axial direction of a rolled body of the adhesive film at the overhang portion are brought into close contact with a guide plate of the feeding apparatus.

In this method for manufacturing an article, the winding core is suppressed from protruding in the axial direction from the rolled body of the adhesive film in a reel body. As a result, when the reel body is set on the feeding apparatus, alignment based on the end faces in the axial direction of the rolled body of the adhesive film is made easier, and the trouble of alignment can be saved.

Advantageous Effects of Invention

According to the present disclosure, the trouble of alignment at the time of setting a reel body on a feeding apparatus can be saved.

DESCRIPTION OF EMBODIMENTS

Hereinafter, suitable embodiments of a reel body, the method for manufacturing a reel body, and a method for manufacturing an article according to an aspect of the present disclosure will be described in detail with reference to the drawings. According to the present specification, a numerical value range shown by using the term "to" includes the numerical values described before and after the term "to" as the minimum value and the maximum value, respectively.

[Configuration of Reel Body]

Figure 1:
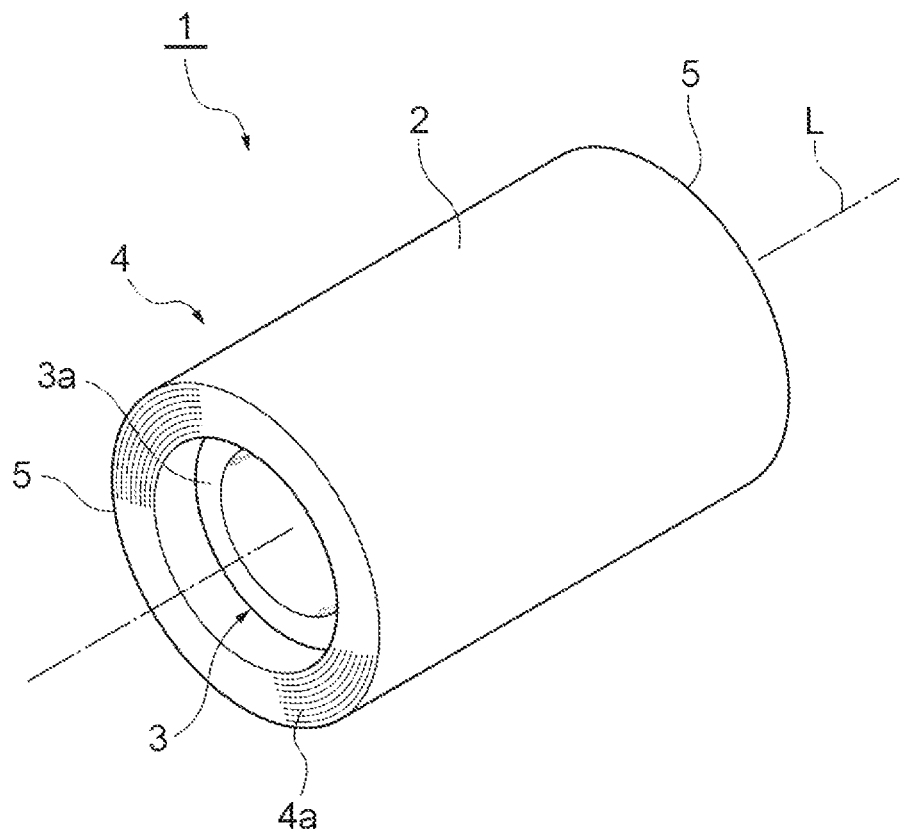
FIG. 1 is a perspective view of a reel body according to an embodiment of the present disclosure.
Figure 2:
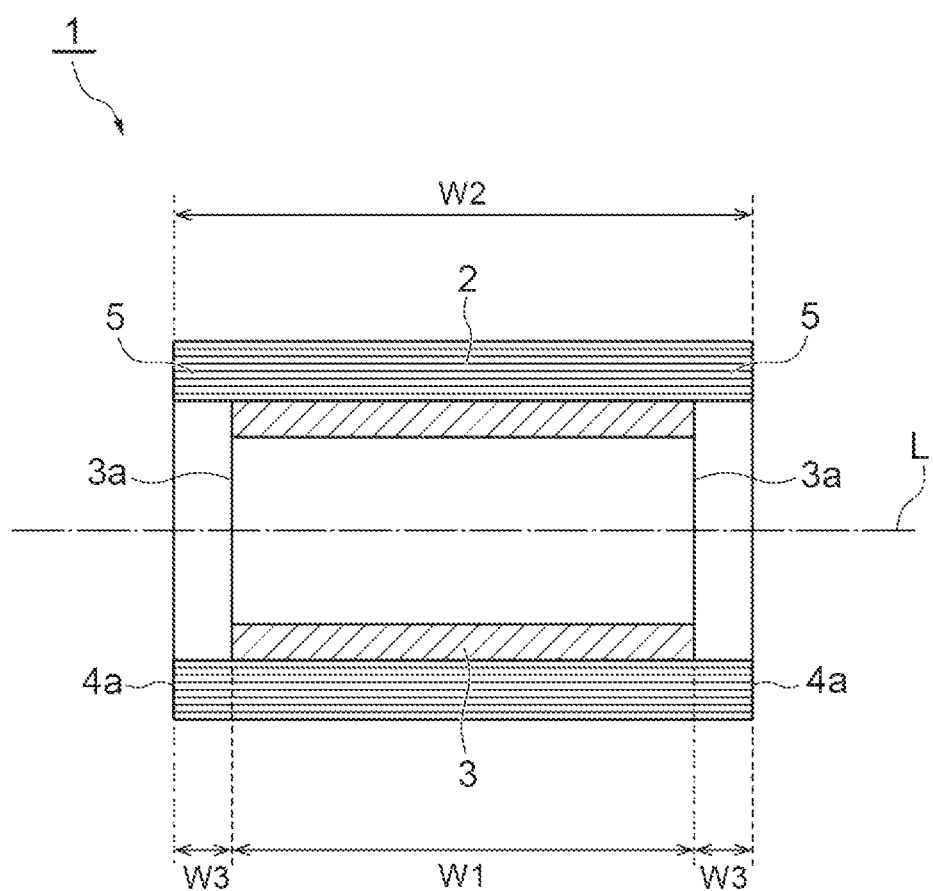
FIG. 2 is a cross-sectional view of the reel body shown in FIG. 1.

FIG. 1 is a perspective view of a reel body according to an embodiment of the present disclosure. FIG. 2 is a cross-sectional view thereof. As shown in FIG. 1 and FIG. 2, the reel body 1 is configured to have an adhesive film 2 wound around a winding core 3. The adhesive film 2 is, for example, a film used for temporary protection of a lead frame in an encapsulation step of encapsulating a semiconductor element mounted on a lead frame. The adhesive film 2 is stuck to the back surface of the lead frame (surface on the opposite side of the surface where a semiconductor element is formed) in the encapsulation step and temporarily protects the lead frame while forming an encapsulation layer that encapsulates the semiconductor element. The adhesive film 2 is peeled off from the back surface of the lead frame after the encapsulation step is completed.

The winding core 3 is a portion around which the adhesive film 2 is wound. The winding core 3 forms, for example, a hollow cylindrical shape and extends along the axial direction L. Examples of the material forming the winding core 3 include polyvinyl chloride (PVC), an ABS resin, and a fiber-reinforced plastic (FRP). The outer diameter of the winding core 3 is, for example, 80 mm to 95 mm. The outer diameter of the winding core 3 may be 82 mm to 92 mm or may be 80 mm to 90 mm. The inner diameter of the winding core 3 is, for example, 70 mm to 85 mm. The inner diameter of the winding core 3 may be 72 mm to 82 mm or may be 75 mm to 80 mm. The length in the axial direction L of the winding core 3 is, for example, 40 mm to 100 mm. The length in the axial direction L of the winding core 3 may be 50 mm to 90 mm or may be 60 mm to 80 mm.

The width W1 in the axial direction L of the winding core 3 is smaller than the width W2 of the adhesive film 2. A rolled body 4 obtained by winding the adhesive film 2 around the winding core 3 is provided with an overhang portion 5 jutting out in the axial direction L of the winding core 3. In the present embodiment, the overhang portion 5 is provided on each of one side and the other side in the axial direction L of the winding core 3. The overhang width W3 of the overhang portions 5 on the one side and the other side in the axial direction L of the winding core 3 is, for example, 1 mm to 15 mm. The overhang width W3 may be 2 mm to 10 mm or may be 3 mm to 7 mm. The overhang width W3 of the overhang portion 5 on the one side in the axial direction L of the winding core 3 and the overhang width W3 of the overhang portion 5 on the other side in the axial direction L of the winding core 3 may be identical with each other or may be different from each other.

The reel body 1 may be handled in a state of being housed in a packaging bag on the occasion of storage or conveyance. In the packaging bag, a single reel body 1 may be housed, or a plurality of reel bodies 1 may be housed. The packaging bag may be formed by using a resin film or may be formed by using a composite resin film having an aluminum layer. Specific examples of the packaging bag include an aluminum-coated plastic bag. Examples of the material of the resin film include plastics such as polyethylene, polyester, vinyl chloride, and polyethylene terephthalate.

The reel body 1 may be housed in a packaging bag, for example, in a vacuum packed state. In the packaging bag, a desiccant may be housed together with the reel body 1. Regarding the desiccant, for example, silica gel may be mentioned. The package may be further wrapped with a cushioning material. The package may be housed in, for example, a packing box such as corrugated cardboard.

Figure 3:
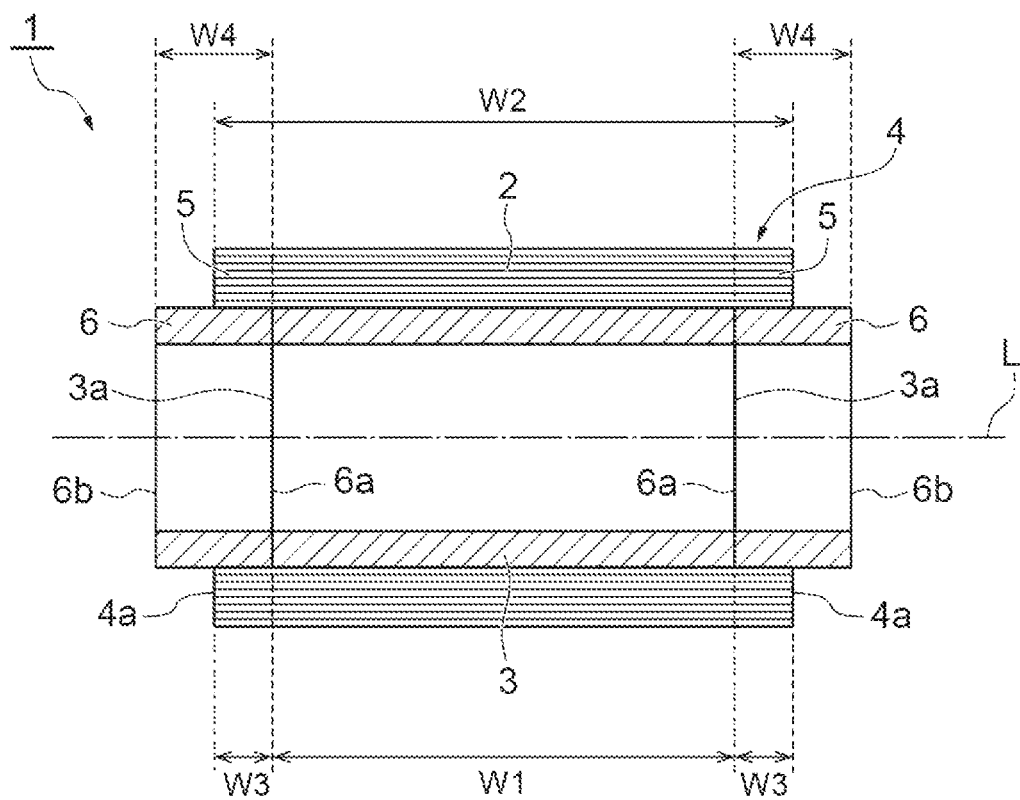
FIG. 3 is a cross-sectional view of a reel body shown in a state of being fitted with an auxiliary core.
Figure 4:
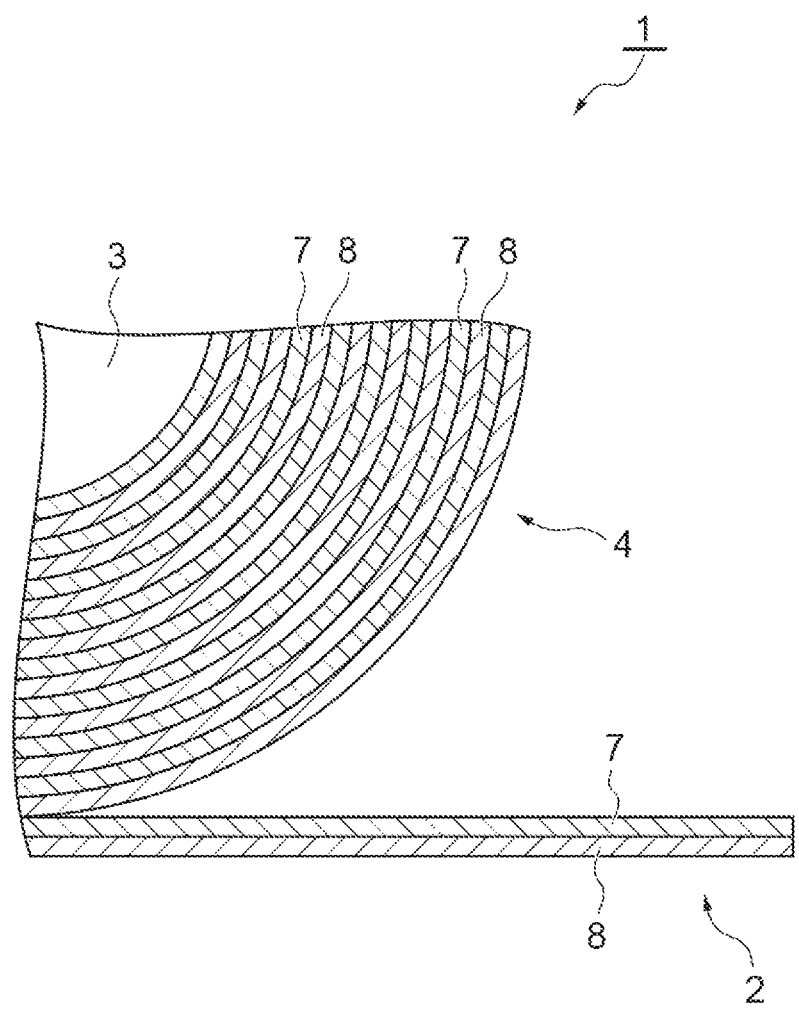
FIG. 4 is a cross-sectional view showing the layer configuration of an adhesive film together with a rolled body.

On the occasion of storage or conveyance of the reel body 1, as shown in FIG. 3, an auxiliary core 6 may be disposed on a side of the inner circumference of the overhang portion 5 in the rolled body 4 of the adhesive film 2. The auxiliary core 6 forms a hollow cylindrical shape having the same diameter as the winding core 3. The auxiliary core 6 constitutes, for example, a separate body from the winding core 3 with the same material as the winding core 3 and is freely attachable and detachable against the side of the inner circumference of the overhang portion 5. In the example of FIG. 3, the auxiliary core 6 is disposed on each of the side of the inner circumference of the overhang portion 5 on one side in the axial direction in the rolled body 4, and the side of the inner circumference of the overhang portion 5 on the other side in the axial direction in the rolled body 4.

In the present embodiment, the width W4 in the axial direction L in the auxiliary core 6 is larger than the overhang width W3 of the overhang portion 5. One end 6*a* in the axial direction L in the auxiliary core 6 is in close contact with the end face 3*a* in the axial direction L in the winding core 3 on the side of the inner circumference of the rolled body 4. The other end 6*b* in the axial direction L in the auxiliary core 6 protrudes from the end face 4*a* in the axial direction L in the rolled body 4. The protrusion width (=W4−W3) of the auxiliary core 6 from the end face 4*a* is not particularly limited; however, the protrusion width is, for example, 5 mm to 10 mm. The protrusion width may be 2 mm to 5 mm or may be 0 mm to 2 mm.

It is not necessarily essential for the auxiliary core 6 to protrude from the end face 4*a*. For example, the width W4 in the axial direction L of the auxiliary core 6 and the overhang width W3 of the overhang portion 5 may be equal, and the other end 6*b* in the axial direction L in the auxiliary core 6 and the end face 4*a* may be aligned. Furthermore, it is also acceptable that the width W4 in the axial direction L of the auxiliary core 6 is smaller than the overhang width W3 of the overhang portion 5, and the other end 6*b* in the axial direction L in the auxiliary core 6 is positioned on the side of the inner circumference of the rolled body 4.

[Configuration of Adhesive Film]

As shown in FIG. 3, the adhesive film 2 is composed of two layers by a base material layer 7 and an adhesive layer 8 provided on one surface side of the base material layer 7. According to the present embodiment, the adhesive film 2 does not have a protective layer on the adhesive layer 8 and is wound around a winding core 3 in a state in which the adhesive layer 8 and the base material layer 7 are contiguous to each other in the radial direction of the winding core 3. In the state of the rolled body 4, the adhesive layer 8 is positioned on the outer side in the radial direction, and the base material layer 7 is positioned on the inner side in the radial direction.

The width of the adhesive film 2 (that is, width W2 in the axial direction L of the rolled body 4) is, for example, 50 mm or more. The width of the adhesive film 2 may be 100 mm or more or may be 200 mm or more. The width of the adhesive film 2 may be 600 mm or less. The width of the adhesive film 2 may be, for example, 50 mm or more and 600 mm or less, may be 100 mm or more and 600 mm or less, or may be 200 mm or more and 600 mm or less.

The coefficient of linear expansion at 30° C. to 200° C. in the in-plane direction of the adhesive film 2 is, for example, 16 ppm/° C. or greater and 20 ppm/° C. or less. The in-plane direction may be, for example, either the MD (Machine Direction) direction or the TD (Transverse Direction) direction. The MD direction is usually the longitudinal direction of the adhesive film 2. The TD direction is a direction (width direction) orthogonal to the MD direction. The measurement of the coefficient of linear expansion can be measured by using a thermomechanical analysis apparatus (for example, manufactured by Seiko Instruments Inc.: SSC5200). The coefficient of linear expansion at 30° C. to 200° C. in the in-plane direction of the adhesive film 2 can be adjusted by, for example, changing the thickness of the adhesive layer 8.

The elastic modulus at 30° C. of the adhesive film 2 is, for example, 9 GPa or less. The elastic modulus at 30° C. of the adhesive film 2 may be 8 GPa or less or may be 7 GPa or less. The elastic modulus at 30° C. of the adhesive film 2 may be 4 GPa or greater or may be 5 GPa or greater. The elastic modulus at 30° C. of the adhesive film 2 can be measured by using a dynamic viscoelasticity measuring apparatus (for example, manufactured by UBM: Rheogel-E4000). In this case, a specimen obtained by cutting the adhesive film 2 into a size of, for example, 4 mm×30 mm is set on a dynamic viscoelasticity measuring apparatus at a distance between chucks of 20 mm. In this state, the elastic modulus at 30° C. of the adhesive film 2 can be determined by measuring the tensile modulus of the specimen under the conditions of sine waves, a temperature range of 30° C. (constant), and a frequency of 10 Hz.

The base material layer 7 is composed of a material having heat resistance against the heat in each step of a step of forming an adhesive layer 8, a step of assembling a semiconductor package, and the like. Such a material may be, for example, at least one polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, polyallylate, an aromatic polyether ether ketone, and polyethylene naphthalate.

From the viewpoint of enhancing the heat resistance, the glass transition temperature of the base material layer 7 may be 200° C. or higher or may be 250° C. or higher. As a result, in the steps where heat is applied, that is, a step of adhering a semiconductor element to a die pad, a wire bonding step, an encapsulation step, and a step of tearing off the temporary protective film from an encapsulation molded body, softening of the base material layer 7 is suppressed, and an enhancement of the operation efficiency can be promoted. Furthermore, the elastic modulus at 230° C. of the base material layer 7 is higher than the elastic modulus at 230° C. of the adhesive layer 8.

The base material layer 7 may have sufficient close adhesiveness to the adhesive layer 8. When the base material layer 7 has sufficient close adhesiveness to the adhesive layer 8, for example, at the time of tearing off the adhesive film 2 from a lead frame and an encapsulant material at a temperature of 100° C. to 300° C., the occurrence of peeling at the interface between the adhesive layer 8 and the base material layer 7 can be suppressed. As a result, the resin remaining on the lead frame and the encapsulant material can be suppressed.

From the viewpoint of sufficiently having both the heat resistance and the close adhesiveness to the adhesive layer 8, the base material layer 7 may be formed by using polyimide. The coefficient of linear expansion at 30° C. to 200° C. of the base material layer 7 based on polyimide may be $3.0\times10^{-5}/°$ C. or less, may be $2.5\times10^{-5}/°$ C. or less, or may be $2.0\times10^{-5}/°$ C. or less. The heat shrinkage rate of the base material layer 7 at the time of heating at 200° ° C. for 2 hours may be 0.15% or less, may be 0.1% or less, or may be 0.05% or less.

The material that constitutes the base material layer 7 is not limited to the above-described resins and can also be selected from the group consisting of copper, aluminum, stainless steel, and nickel. When the base material layer 7 is formed by using these metals, it is possible to bring the coefficient of linear expansion of the adhesive film 2 closer to the coefficient of linear expansion of the lead frame. In this case, the warpage of the lead frame at the time of sticking the adhesive film 2 to the lead frame can be suitably reduced.

The base material layer 7 may be subjected to a surface treatment. Examples of the type of the surface treatment include: chemical treatments such as an alkali treatment and a silane coupling treatment; physical treatments such as a sand mat treatment; a plasma treatment; and a corona treatment. By applying a surface treatment, the close adhesiveness to the adhesive layer 8 can be more sufficiently increased.

From the viewpoint of reducing the warpage of the lead frame when the adhesive film 2 is stuck to the lead frame, the thickness of the base material layer 7 may be, for example, 100 μm or less, may be 50 μm or less, or may be 25 μm or less. The thickness of the base material layer 7 may be 5 μm or more or may be 10 μm or more.

The adhesive layer 8 is formed by using, for example, a thermoplastic resin having an amide group (—NHCO—), an ester group (—CO—O—), an imide group (—NR$_2$, provided that each R is —CO—), an ether group (—O—), or a sulfone group (—SO$_2$—). These resins may be thermoplastic resins having an amide group, an ester group, an imide group, or an ether group. Specifically, examples of such a thermoplastic resin include an aromatic polyamide, an aromatic polyester, an aromatic polyimide, an aromatic polyamideimide, an aromatic polyether, an aromatic polyetheramideimide, an aromatic polyetheramide, an aromatic polyesterimide, and an aromatic polyetherimide. From the viewpoints of heat resistance and adhesiveness, the thermoplastic resin may be at least one resin selected from the group consisting of an aromatic polyetheramideimide, an aromatic polyetherimide, and an aromatic polyetheramide.

The above-described resins can all be produced by subjecting a base component such as an aromatic diamine or a bisphenol and an acid component such as a dicarboxylic acid, a tricarboxylic acid, a tetracarboxylic acid, or an aromatic chloride, or reactive derivatives of these to polycondensation. That is, the production of the above-described resins can be carried out by a conventional method that is used for the reaction between an amine and an acid, and there are no particular limitations in the general conditions and the like. For a polycondensation reaction between an aromatic dicarboxylic acid, an aromatic tricarboxylic acid, or reactive derivatives of these and a diamine as well, a conventional method is used.

Regarding the base component used for the synthesis of an aromatic polyetherimide, an aromatic polyetheramideimide, and an aromatic polyetheramide, for example, an aromatic diamine having an ether group, such as 2,2-bis[4-(4-aminophenoxy)phenyl]propane, bis[4-(4-aminophenoxy)phenyl]sulfone, 4,4'-diaminodiphenyl ether, bis[4-(4-aminophenoxy)phenyl] ether, or 2,2-bis[4-(4-aminophenoxy)]hexafluoropropane; an aromatic diamine that does not have an ether group, such as 4,4'-methylenebis (2,6-diisopropylamine); a siloxanediamine such as 1,3-bis (3-aminopropyl)-tetramethyldisiloxane; and an α,ω-diaminoalkane such as 1,12-diaminododecane and 1,6-diaminohexane, can be used.

In the total amount of the base component, the above-described aromatic diamine having an ether group may be used in an amount of 40 mol % to 100 mol % or 50 mol % to 97 mol %, and at least one selected from the aromatic diamine that does not have an ether group, the siloxanediamine, and the α,ω-diaminoalkane may be used in an amount of 0 mol % to 60 mol % or 3 mol % to 50 mol %. Specific examples of the base component include: (1) a base component composed of 60 mol % to 89 mol % or 68 mol % to 82 mol % of an aromatic diamine having an ether group, 1 mol % to 10 mol % or 3 mol % to 7 mol % of a siloxanediamine, and 10 mol % to 30 mol % or 15 mol % to 25 mol % of an α,ω-diaminoalkane; (2) a base component composed of 90 mol % to 99 mol % or 93 mol % to 97 mol % of an aromatic diamine having an ether group and 1 mol % to 10 mol % or 3 mol % to 7 mol % of a siloxanediamine; and (3) a base component composed of 40 mol % to 70 mol % or 45 mol % to 60 mol % of an aromatic diamine having an ether group and 30 mol % to 60 mol % or 40 mol % to 55 mol % of an aromatic diamine that does not include an ether group.

Examples of the acid component used for the synthesis of the aromatic polyetherimide, aromatic polyetheramideimide, and aromatic polyetheramide include: (A) mononuclear aromatic tricarboxylic acid anhydrides and mononuclear aromatic tetracarboxylic acid dianhydrides, such as trimellitic anhydride, a reactive derivative of trimellitic anhydride such as trimellitic anhydride chloride, and pyromellitic dianhydride; (B) polynuclear aromatic tetracarboxylic acid dianhydrides such as bisphenol A bistrimellitate dianhydride and oxydiphthalic anhydride; and (C) aromatic dicarboxylic acids such as terephthalic acid, isophthalic acid, terephthalic acid chloride, and a reactive derivative of phthalic acid such as isophthalic acid chloride. Among these, an aromatic polyetheramideimide obtainable by reacting 0.95 to 1.05 mol or 0.98 to 1.02 mol of the above-described acid component (A) per 1 mol of the above-described base component (1) or (2), and an aromatic polyetherimide obtainable by reacting 0.95 to 1.05 mol or 0.98 to 1.02 mol of the above-described acid component (B) per 1 mol of the above-described base component (3), can be used.

The adhesive layer 8 may contain a component other than the above-described resin. Examples of the other component include: fillers such as a ceramic powder, a glass powder, a silver powder, a copper powder, resin particles, and rubber particles; an oxidation inhibitor; and a coupling agent. When the adhesive layer 8 contains a filler as the other component, the content of the filler may be 1 to 30 parts by mass or may be 5 to 15 parts by mass, with respect to 100 parts by mass of the resin.

Regarding the coupling agent, for example, vinylsilane, epoxysilane, aminosilane, mercaptosilane, a titanate, an aluminum chelate, and a zircoaluminate can be used. The coupling agent may be a silane coupling agent. Regarding the silane coupling agent, coupling agents having organic reactive groups at the ends of vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, and the like, and among these, an epoxysilane coupling agent having an epoxy group can be used.

The organic reactive group is a functional group such as an epoxy group, a vinyl group, an amino group, or a mercapto group. The addition of a silane coupling agent provides an effect of enhancing the close adhesiveness of the adhesive layer 8 to the base material layer 7 and suppressing the occurrence of peeling at the interface between the base material layer 7 and the adhesive layer 8 at the time of peeling at a temperature of 100° C. to 300° C. When the adhesive layer 8 contains a coupling agent, the content of the coupling agent may be 1 to 15 parts by mass or may be 2 to 10 parts by mass with respect to 100 parts by mass of the resin.

The thickness of the adhesive layer 8 is, for example, 20 μm or less. The thickness of the adhesive layer 8 may be 18 μm or less, 16 μm or less, 14 μm or less, 12 μm or less, 10 μm or less, 9 μm or less, or 8 μm or less. The thickness of the adhesive layer 8 is, for example, 1 μm or more. The thickness of the adhesive layer 8 may be 2 μm or more, 3 μm or more, 4 μm or more, 5 μm or more, 6 μm or more, 7 μm or more, or 8 μm or more. The thickness of the adhesive layer 8 may be 1 μm or more and 20 μm or less, may be 1 μm or more and 15 μm or less, or may be 1 μm or more and 8 μm or less.

When the thickness of the adhesive layer 8 is 1 μm or more, sufficient adhesiveness can be secured, and at the same time, fall-off of the encapsulant material at the time of encapsulation can be suppressed. When the thickness of the adhesive layer 8 is 20 μm or less, the overall layer thickness of the adhesive film 2 is suppressed, and the cost is suppressed. Furthermore, the generation of voids at the time of performing a heat treatment at 300° C. or higher can be suppressed. Furthermore, when the thickness of the adhesive layer 8 is 20 μm or less, an increase in the wettability at the time of a heat treatment can be suppressed. As a result, the adhesive layer 8 sticking to the lead frame with an excessive adhesive strength can be suppressed, and peelability can be secured.

The ratio of the thickness of the adhesive layer 8 to the thickness of the base material layer 7 is, for example, 0.2 or less. The ratio of the thickness of the adhesive layer 8 to the thickness of the base material layer 7 may be 0.1 or less or may be 0.05 or less. As a result, the warpage caused by the volume reduction at the time of solvent removal after application of the adhesive layer 8 on the base material layer 7 is suppressed, and the workability at the time of sticking the adhesive film 2 to the lead frame can be enhanced.

The glass transition temperature (Tg) of the adhesive layer 8 is higher than normal temperature (for example, 25° C.). The glass transition temperature (Tg) of the adhesive layer 8 may be, for example, 100° C. or higher or may be 150° C. or higher. The glass transition temperature of the adhesive layer 8 may be, for example, 300° C. or lower or may be 250° C. or lower. In a case where the glass transition temperature of the adhesive layer 8 is 100° C. or higher, when the adhesive film 2 is peeled off from the lead frame and the encapsulant material, peeling at the interface between the base material layer 7 and the adhesive layer 8 is suppressed, and the cohesive failure of the adhesive layer 8 is suppressed.

When the glass transition temperature of the adhesive layer 8 is 100° C. or higher, remaining of the adhesive layer 8 on the lead frame and the encapsulant material can be suppressed. Furthermore, softening of the adhesive layer 8 by the heat in the wire bonding step can be suppressed, and the occurrence of defective joining of the wire can be reduced. In addition, softening of the adhesive layer 8 caused by the heat in the encapsulation step can be suppressed, and the occurrence of inconvenience that the encapsulant material penetrates between the lead frame and the adhesive layer 8 can be suppressed. When the glass transition temperature of the adhesive layer 8 is 300° C. or lower, softening of the adhesive layer 8 at the time of adhesion is sufficiently suppressed. Furthermore, a sufficient peel strength at a peeling angle of 90° between the adhesive film 2 and the lead frame at normal temperature (for example, 25° C.) can be secured.

The glass transition temperature of the adhesive layer 8 can be measured by using a thermomechanical analysis apparatus (manufactured by Seiko Instruments Inc.: SSC5200 type). The measurement conditions can be set to, for example, a tensile mode at a distance between chucks of 10 mm, a temperature range of 30° C. to 300° C., and a rate of temperature increase of 10° C./min.

The 5% weight reduction temperature of the adhesive layer 8 may be 300° C. or higher, may be 350° C. or higher, or may be 400° C. or higher. When the 5% weight reduction temperature of the adhesive layer 8 is 300° C. or higher, outgases caused by the heat at the time of sticking the adhesive film 2 to the lead frame and the heat in the wire bonding step are not likely to be generated, and contamination of the lead frame, the wire, and the like can be suppressed. The 5% weight reduction temperature can be measured by using a differential thermal balance (for example, manufactured by Seiko Instruments Inc.: SSC5200 type). The measurement conditions can be set to, for example, a rate of temperature increase of 10° C./min in an air atmosphere.

The elastic modulus at 230° C. of the adhesive layer 8 is, for example, 1 MPa or greater. The elastic modulus at 230° C. of the adhesive layer 8 may be 3 MPa or greater. In the manufacturing process for a semiconductor package, the temperature in the wire bonding step (wire bonding temperature) is not particularly limited; however, the temperature is generally about 200° C. to 260° C. and is approximately 230° C. Therefore, when the elastic modulus at 230° C. of the adhesive layer 8 is 1 MPa or greater, softening of the adhesive layer 8 caused by the heat in the wire bonding step is suppressed, and the occurrence of defective joining of the wire can be suppressed. The elastic modulus at 230° C. of the adhesive layer 8 is, for example, 2000 MPa or less. The elastic modulus at 230° C. of the adhesive layer 8 may be 1500 MPa or less or may be 1000 MPa or less.

The elastic modulus at 230° C. of the adhesive layer 8 can be measured by using a dynamic viscoelasticity measuring apparatus (for example, manufactured by UBM: Rheogel-E4000). In this case, the measurement conditions can be set to a tensile mode at a distance between chucks of 20 mm, sine waves, a frequency of 10 Hz, and a rate of temperature increase of 5° C./min.

The method for forming the adhesive layer 8 on the base material layer 7 is not particularly limited; however, for example, a method of applying a resin varnish produced by dissolving a resin in a solvent on the surface of the base material layer 7 and subsequently removing the solvent by performing a heating treatment, can be used. Regarding the solvent, N-methyl-2-pyrrolidone, dimethylacetamide, diethylene glycol dimethyl ether, tetrahydrofuran, cyclohexanone, methyl ethyl ketone, dimethylformamide, and the like can be used. A method of applying a precursor varnish obtained by dissolving a precursor of a resin in a solvent on the surface of the base material layer 7 and subsequently removing the solvent by performing a heating treatment, can also be used. When the resin that constitutes the adhesive layer 8 is a polyimide resin, the precursor is, for example, polyamic acid.

The temperature of the heating treatment may be different between the case where a resin varnish is used and the case where a precursor varnish is used. In the case of a resin varnish, the temperature of the heating treatment may be any temperature at which the solvent can be removed. In the case of a precursor varnish, the temperature of the heating treatment may be equal to or higher than the glass transition temperature of the adhesive layer 8 in order to form a resin from the precursor (for example, imidization).

The method of applying a resin varnish or a precursor varnish on the surface of the base material layer 7 is not particularly limited; however, for example, roll coating, reverse roll coating, gravure coating, bar coating, comma coating, die coating, or reduced pressure die coating can be used. Furthermore, the resin varnish or the precursor varnish may be applied on the surface of the base material layer 7 by immersing the base material layer 7 in the resin varnish or the precursor varnish.

The adhesive film 2 may also have a three-layer configuration by further including a non-adhesive layer (not shown in the diagram) on the other surface side of the base material layer 7 (opposite surface side of the adhesive layer 8). Regarding the non-adhesive layer, a resin layer that substantially does not have adhesiveness (or pressure-sensitive adhesiveness) to the lead frame at 0° C. to 270° C. may be mentioned. For the formation of the non-adhesive layer, for example, a thermoplastic resin or a thermosetting resin can be used. Regarding the thermoplastic resin, for example, a resin having an amide group, an ester group, an imide group, or an ether group may be mentioned. Examples of the thermosetting resin include an epoxy resin, a phenol resin, and a bismaleimide resin (for example, a bismaleimide resin having bis(4-maleimidophenyl)methane as a monomer). A thermoplastic resin and a thermosetting resin may be used as a mixture. When such a non-adhesive layer is provided on the other surface side of the base material layer 7, the warpage of the adhesive film 2 caused by the volume reduction of the adhesive layer 8 can be canceled by the volume reduction of the non-adhesive layer at the time of solvent removal, and shrinkage of the non-adhesive layer at the time of imidization of the non-adhesive layer, curing of the thermosetting resin, and the like.

[Method for Manufacturing Reel Body]

On the occasion of manufacturing the reel body 1, a winding step of winding an adhesive film 2 having an adhesive layer 8 on a base material layer 7 around a winding core 3 is carried out. In the winding step, the winding core 3 having a smaller width W1 in the axial direction L than the width W2 of the adhesive film 2 is used, and the adhesive film 2 that does not have a protective layer on the adhesive layer 8 is wound around the winding core 3 while causing the adhesive layer 8 and the base material layer 7 to be contiguous to each other in the radial direction of the winding core 3. As a result, an overhang portion 5 jutting out in the axial direction L of the winding core 3 is formed in a rolled body 4 of the adhesive film 2.

Figure 5:
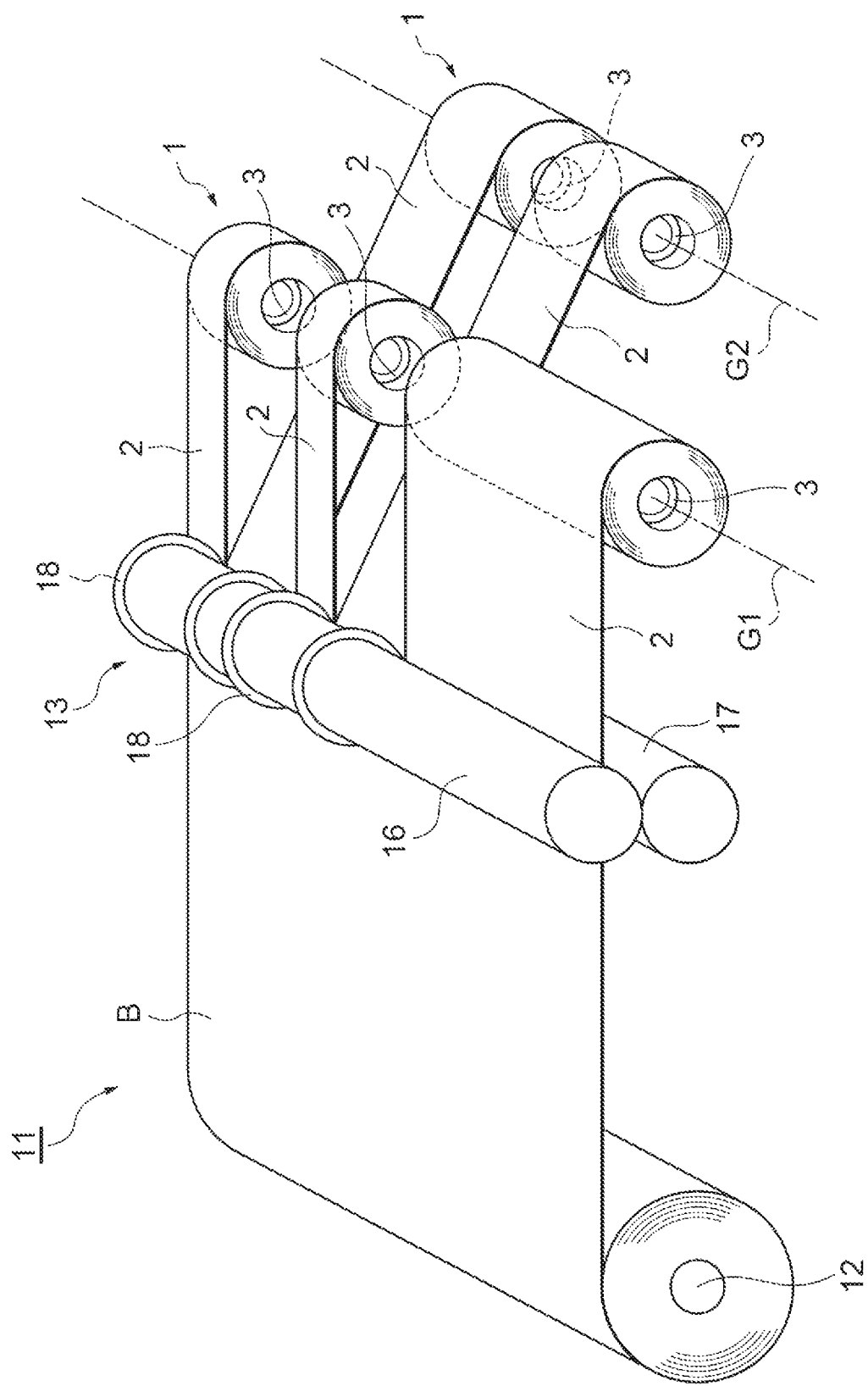
FIG. 5 is a schematic perspective view illustrating an example of a manufacturing apparatus for a reel body.

When performing the winding step, for example, a manufacturing apparatus 11 shown in FIG. 5 can be used. In FIG. 5, the right-to-left direction is designated as the horizontal direction, and the up-to-down direction is designated as the vertical direction. The manufacturing apparatus 11 shown in the same diagram cuts a plurality of adhesive films 2 from a parent material B of an adhesive film 2 and winds each of the cut adhesive films 2 to form reel bodies 1. As shown in FIG. 5, the manufacturing apparatus 11 includes a pay-out roller 12, a cutting part 13, and a plurality of winding cores 3.

The pay-out roller 12 is a portion that continuously pays out the parent material B of the adhesive film 2. The parent material B of the adhesive film 2 continuously paid out from the pay-out roller 12 is horizontally conveyed toward the cutting part 13 at a predetermined speed. The cutting part 13 is a portion that cuts out a plurality of adhesive films 2 having predetermined widths from the parent material B of the adhesive film 2. The cutting part 13 has: an upper shaft 16 and a lower shaft 17 disposed as a pair disposed up and down with the parent material B interposed therebetween; a plurality of disc-shaped upper blades 18 provided on the upper shaft 16; and a plurality of disc-shaped lower blades (not shown in the diagram) provided on the lower shaft 17.

The upper blades 18 and the lower blades are in a state in which, for example, the side surfaces of the blade tips are in sliding contact with each other, and the parent material B is cut by a shear cutting method. The widths of the plurality of adhesive films 2 cut by the cutting part 13 are adjusted by changing the distances in the axial direction between the upper blades 18 and the lower blades. In the present embodiment, a plurality of adhesive films 2 having different widths are cut out from the parent material B of the adhesive film 2 by the cutting part 13.

Winding tension is applied to the parent material B and the plurality of adhesive films 2 extending from the pay-out roller 12 through the cutting part 13 to the winding cores 3. For the impartment of the winding tension to the parent material B and the plurality of adhesive films 2, tension rollers may be used, or an adjustment mechanism for adjusting the axial positions of the pay-out roller 12 and the winding cores 3 may be used. The winding tension is not particularly limited; however, for example, the winding tension is 60 N/m or more. The winding tension may be 70 N/m or more or may be 80 N/m or more. The winding tension is, for example, 150 N/m or less. The winding tension may be 140 N/m or less or may be 130 N/m or less.

A plurality of winding cores 3 is a portion on which each of the plurality of adhesive films 2 is wound. A winding core 3 that is set on the manufacturing apparatus 11 directly becomes the winding core 3 of a reel body 1. On the winding core 3, the adhesive film 2 is wound such that the adhesive layer 8 faces outward in the radial direction. According to the present embodiment, the plurality of winding cores 3 are set on a first shaft G1 and a second shaft G2. The first shaft G1 and the second shaft G2 are in a state of being at least shifted from each other in the horizontal direction. The winding cores 3 of the first shaft G1 and the winding cores 3 of the second shaft G2 are alternately disposed in the axial directions. Each of these winding cores 3 has a width W1 smaller than the width W2 of the adhesive film 2 as an object of winding in the axial direction L. As a result, in the reel body 1 obtained by winding the adhesive film 2 on each of the winding cores 3, an overhang portion 5 jutting out in the axial direction L of the winding core 3 is formed in the rolled body 4.

[Method for Manufacturing Article]

Figure 6:
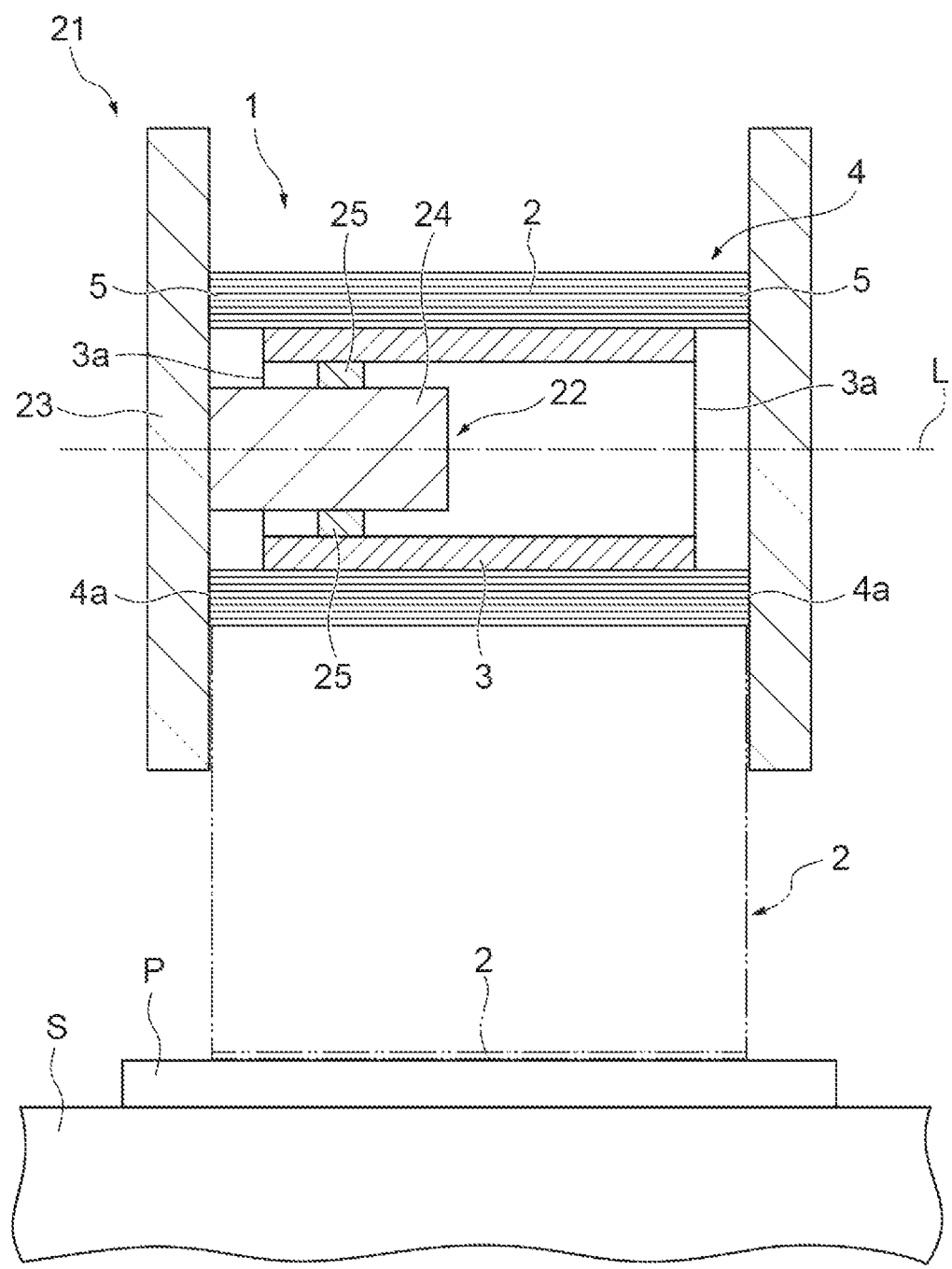
FIG. 6 is a schematic diagram illustrating an example of a manufacturing apparatus for an article using a reel body.

In the method for manufacturing an article using the reel body 1, a joining step of joining the adhesive film 2 wound off from the reel body 1 to an adherend P is carried out. Here, the adherend P is a lead frame on which a semiconductor element is mounted. The adherend P is placed on, for example, a conveyance stage S and is made conveyable in the joining direction of the adhesive film 2. In the joining step, for example, a feeding apparatus 21 shown in FIG. 6 can be used. In the example of FIG. 6, the feeding apparatus 21 is configured to include a winding core tool 22 and a guide plate 23 and is disposed above the conveyance stage S where the adherend P is placed.

The winding core tool 22 is a tool in which protrusion parts 25 are provided on the peripheral surface of the winding core 24 capable of rotating upon shaft rotation. The protrusion parts 25 are provided to be capable of protruding in the radial direction from the peripheral surface of the winding core 24. The protrusion parts 25 are driven by, for example, air or the like and are capable of freely protruding and retreating with respect to the peripheral surface of the winding core 24. As the reel body 1 is passed through the winding core 24, and the side of the inner circumference of the winding core 3 in the reel body 1 is supported by the protrusion parts 25, the reel body 1 is set on the winding core tool 22. When an auxiliary core 6 is disposed in the reel body 1, the auxiliary core 6 may be removed from the reel body 1 immediately before setting the reel body 1 on the winding core tool 22.

The guide plate 23 is a plate-shaped member used for the alignment of the adhesive film 2 that is wound off from the reel body 1 by the feeding apparatus 21. The guide plate 23 forms, for example, a disc shape having a sufficiently large diameter relatively to the diameter of the reel body 1. In the guide plate 23, the winding core 24 of the winding core tool 22 is inserted. After the reel body 1 is passed through the winding core 3, the end face 4a in the axial direction L in the rolled body 4 is brought into close contact with one surface side of the guide plate 23. As a result, alignment of the adhesive film 2 that is wound off from the reel body 1 can be carried out by the feeding apparatus 21 based on the end face 4a in the axial direction L of the rolled body 4. By rotating the winding core tool 22 in this state and winding off the adhesive film 2 toward the adherend P, the adhesive film 2 is joined to the adherend P.

On the opposite side from the guide plate 23 across the reel body 1, a presser plate 26 may be disposed to face the guide plate 23. The presser plate 26 forms, for example, a disc shape having the same diameter as the guide plate 23. By disposing the presser plate 26, the position of the reel body 1 during feeding can be further stabilized. The disposition of the presser plate 26 may be omitted.

[Operating Effect]

In a common reel body, the width in the axial direction of the winding core and the width of the adhesive film are aligned, and when the reel body is set on a feeding apparatus, alignment is achieved based on the end faces in the axial direction of a rolled body of the adhesive film. However, conventional reel bodies have a problem that when the adhesive film is even slightly shifted in the axial direction at the time of winding, the winding core protrudes in the axial direction from the rolled body of the adhesive film. When the winding core protrudes in the axial direction, alignment cannot be based on the end faces in the axial direction of the rolled body of the adhesive film, and trouble occurs in the alignment when setting the rolled body on the feeding apparatus. Particularly, in an adhesive film that has no protective layer on the adhesive layer and is wound around the winding core in a state in which the adhesive layer and the base material layer are contiguous to each other in the radial direction of the winding core, even when force is applied to the rolled body, it is difficult to move the position of the adhesive film with respect to the winding core, and there is a risk that it may be necessary to perform alignment for each and every reel body to be set.

In contrast, in the reel body 1 of the present embodiment, the width W1 in the axial direction L of the winding core 3 is smaller than the width W2 of the adhesive film 2, and the rolled body 4 of the adhesive film 2 juts out in the axial direction L of the winding core 3. For this reason, even when the adhesive film 2 is slightly shifted in the axial direction L of the winding core 3 at the time of winding, the winding core 3 can be suppressed from protruding in the axial direction L from the rolled body 4 of the adhesive film 2. By suppressing the protrusion of the winding core 3, when the reel body 1 is set on the feeding apparatus 21, alignment based on the end face 4a in the axial direction L of the rolled body 4 of the adhesive film 2 is made easier, and the trouble of alignment can be saved. Furthermore, since the process is finished without aligning the width W1 in the axial direction L of the winding core 3 to the width W2 of the adhesive film 2, commonization of the winding core 3 for adhesive films 2 having different widths is also made possible.

According to the present embodiment, the overhang portion 5 is provided on each of one side and the other side in the axial direction L of the winding core 3. As a result, the position shift of the adhesive film 2 at the time of winding can be allowed for each of the one side and the other side in the axial direction L of the winding core 3.

According to the present embodiment, an auxiliary core 6 that has the same diameter as the winding core 3 and is freely attachable and detachable is disposed on the side of the inner circumference of the overhang portion 5. Since the overhang portion 5 is maintained on the side of the inner circumference by the disposition of the auxiliary core 6, the occurrence of undulation of the adhesive film 2 at the overhang portion 5 can be suppressed. When setting the reel body 1 on the feeding apparatus 21, alignment based on the end face 4a in the axial direction L of the rolled body 4 of the adhesive film 2 can be carried out easily by removing the auxiliary core 6.

Modification Example

The present disclosure is not intended to be limited to the above-described embodiment. For example, in the above-described embodiment, the overhang portion 5 is provided on each of one side and the other side in the axial direction L of the winding core 3; however, as shown in FIG. 7(a) and FIG. 7(b), the overhang portion 5 may be provided only on either of the one side and the other side in the axial direction L of the winding core 3. In this case, a large allowance of position shift of the adhesive film at the time of winding can be secured either on one side or on the other side in the axial direction L.

In the configurations of FIG. 7(a) and FIG. 7(b), on the opposite side of the overhang portion 5, the end face 4a in the axial direction L of the rolled body 4 and the end face 3a in the axial direction L of the winding core 3 are aligned. Therefore, in a case where the overhang portion 5 and the end face 4a on the opposite side are used as the basis of alignment, restrictions at the time of setting the reel body 1 on the feeding apparatus 21 can be avoided irrespective of the width W3 in the axial direction L of the overhang portion 5. For example, in a case where the width in the axial direction L of the winding core tool 22 in the feeding apparatus 21 does not match the width W3 in the axial direction of the overhang portion 5, and when the winding core tool 22 is passed through the reel body 1 from the overhang portion 5 side, the winding core tool 22 does not reach the winding core 3 of the reel body 1, the winding core tool 22 may be passed through the reel body 1 from the opposite side of the overhang portion 5.

Figure 7:
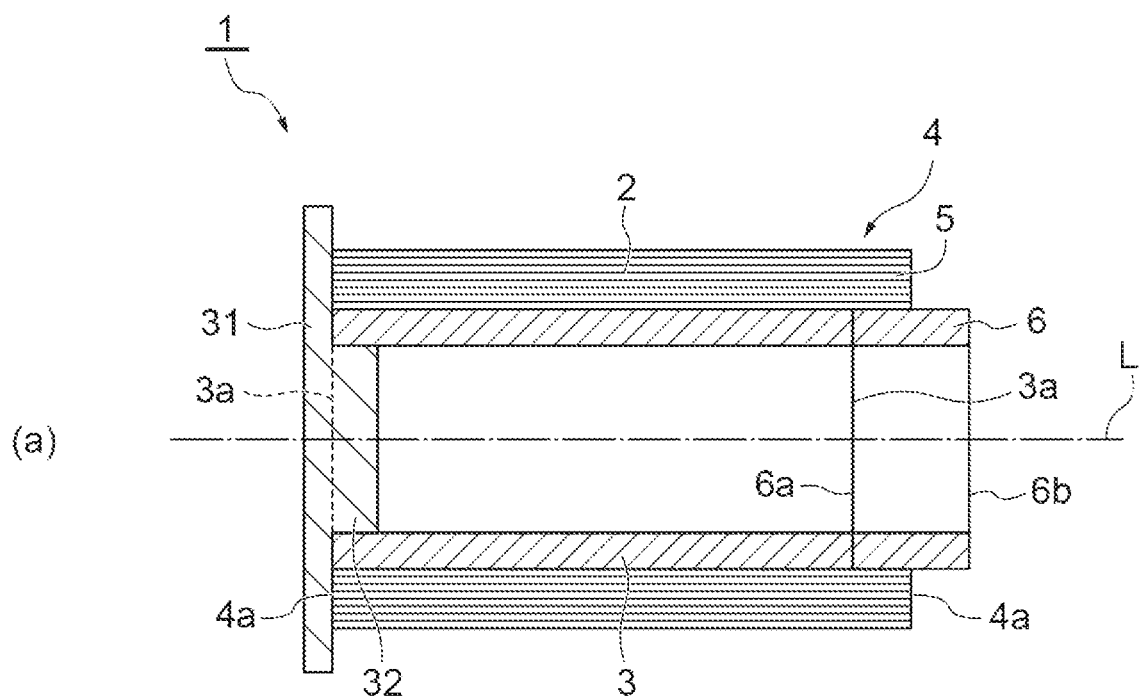
FIG. 7($a$) and FIG. 7($b$) are cross-sectional views of reel bodies according to modification examples.
Figure 7:
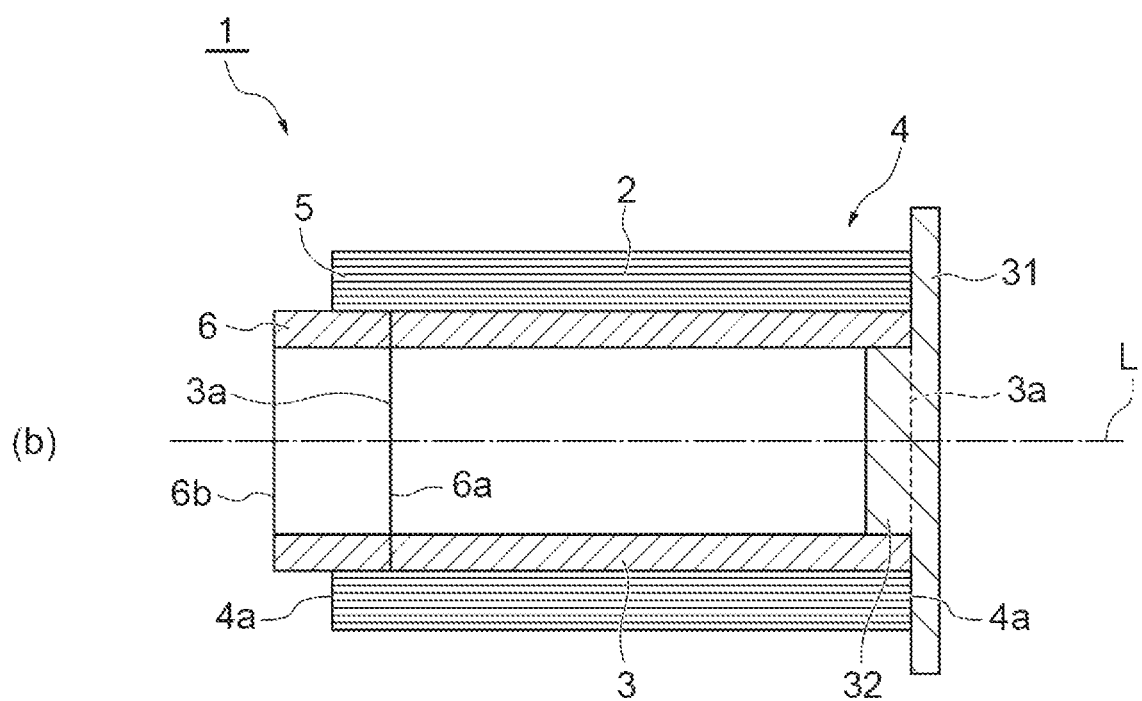

In the examples of FIG. 7(*a*) and FIG. 7(*b*), similarly to the case of FIG. 3, an auxiliary core 6 is disposed on the side of the inner circumference of the overhang portion 5. On the opposite side of the overhang portion 5, at the end face 4a in the axial direction L of the rolled body 4, a guide plate 31 that aligns the periphery in the width direction of the adhesive film 2 at the end face 4a may be disposed. In the examples of FIG. 7(*a*) and FIG. 7(*b*), the guide plate 31 forms a disc shape having a larger diameter than the diameter of the rolled body 4. On the inner surface side of the guide plate 31, a convex part 32 that fits into the hollow portion of the winding core 3 is provided. Due to the convex part 32, the guide plate 31 is freely attachable and detachable with respect to the winding core 3. In a state in which the convex part 32 is fitted into the hollow portion of the winding core 3, the inner surface of the guide plate 31 is in close contact with the end face 4a in the axial direction L of the rolled body 4. Due to such disposition of the guide plate 31, the end face 4a in the axial direction L of the rolled body 4 that serves as the basis of alignment in the feeding apparatus 21 can be protected.

The guide plate 31 may also be applied to the reel body 1 shown in FIG. 2. In this case, the guide plate 31 may be disposed at both the end face 4a in the overhang portion 5 on one side in the axial direction L and the end face 4a in the overhang portion 5 on the other side in the axial direction L or may be disposed at one side. It is also possible to use the guide plate 31 and the auxiliary core 6 in combination.

REFERENCE SIGNS LIST

1: reel body, 2: adhesive film, 3: winding core, 4: rolled body, 4a: end face, 5: overhang portion, 6: auxiliary core, 7: base material layer, 8: adhesive layer, 21: feeding apparatus, 22: winding core tool, 31: guide plate, L: axial direction, P: adherend, W1: width in axial direction of winding core, W2: width of adhesive film.

The invention claimed is:

1. A reel body obtainable by winding an adhesive film having an adhesive layer on a base material layer around a winding core,
   wherein the adhesive film does not have a protective layer on the adhesive layer and is wound around the winding core in a state in which the adhesive layer and the base material layer are contiguous to each other in a radial direction of the winding core,
   wherein a width of the winding core in an axial direction is smaller than a width of the adhesive film,
   wherein a rolled body of the adhesive film is provided with an overhang portion jutting out in the axial direction of the winding core,
   wherein on a side of an inner circumference of the overhang portion, an auxiliary core which is freely attachable and detachable, is disposed,
   wherein the auxiliary core has the same diameter as a diameter of the winding core in terms of overall width of the auxiliary core, and
   wherein one end surface of the auxiliary core in the axial direction comes into contact with one end surface of the winding core in the axial direction.

2. The reel body according to claim 1, wherein the overhang portion is provided on both sides in the axial direction of the winding core.

3. The reel body according to claim 1, wherein the overhang portion is provided only on one side in the axial direction of the winding core.

4. The reel body according to claim 1, wherein at an end face in the axial direction of the rolled body of the adhesive film, a guide plate for aligning an edge in a width direction of the adhesive film with the end face, is disposed.

5. The reel body according to claim 1, wherein the one end surface of the auxiliary core in the axial direction has a flat surface.

6. The reel body according to claim 1, wherein the one end surface of the winding core in the axial direction has a flat surface.

7. The reel body according to claim 1, wherein a width of the auxiliary core in the axial direction is larger than a width of the overhang portion.

8. A method for manufacturing a reel body, the method comprising winding an adhesive film having an adhesive layer on a base material layer around a winding core,
   wherein, in the winding, the winding core having a smaller width in an axial direction than a width of the adhesive film is used, and the adhesive film having no protective layer on the adhesive layer is wound around the winding core while causing the adhesive layer and the base material layer to be contiguous to each other in a radial direction of the winding core, so as to form an overhang portion jutting out in the axial direction of the winding core in a rolled body of the adhesive film,
   wherein on a side of an inner circumference of the overhang portion, an auxiliary core which is freely attachable and detachable, is disposed,
   wherein the auxiliary core has the same diameter as a diameter of the winding core in terms of overall width of the auxiliary core, and
   wherein one end surface of the auxiliary core in the axial direction comes into contact with one end surface of the winding core in the axial direction.

9. A method for manufacturing an article, the method comprising joining the adhesive film wound off from the reel body according to claim 1 to an adherend,
   wherein, in the joining, the side of the inner circumference of the overhang portion in the reel body is fixed to a winding core tool of a feeding apparatus, and at the same time, the adhesive film is wound off toward the adherend in a state in which an end face in the axial direction of the rolled body of the adhesive film in the overhang portion is brought into close contact with a guide plate of the feeding apparatus.

* * * * *